United States Patent
Cho et al.

(10) Patent No.: US 8,368,604 B2
(45) Date of Patent: Feb. 5, 2013

(54) APPARATUS AND METHOD FOR MEASURING RADIATED POWER OF TERMINAL

(75) Inventors: In-Kui Cho, Daejeon (KR); Je-Hoon Yun, Daejeon (KR); Seong-Min Kim, Daejeon (KR); Young-Hwan Lee, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 396 days.

(21) Appl. No.: 12/813,944

(22) Filed: Jun. 11, 2010

(65) Prior Publication Data

US 2011/0133999 A1 Jun. 9, 2011

(30) Foreign Application Priority Data

Dec. 4, 2009 (KR) ........................ 10-2009-0120113

(51) Int. Cl.
*G01R 29/10* (2006.01)
*H01Q 3/00* (2006.01)
*H03C 1/62* (2006.01)

(52) U.S. Cl. ...................... 343/703; 455/115.1; 324/359; 324/360

(58) Field of Classification Search .................. None
See application file for complete search history.

(56) References Cited

U.S. PATENT DOCUMENTS

| 6,748,246 | B1 * | 6/2004 | Khullar .......................... 455/574 |
| 7,248,217 | B2 | 7/2007 | Mani et al. | |
| 7,336,230 | B2 * | 2/2008 | Lee et al. ....................... 343/703 |
| 7,847,743 | B2 * | 12/2010 | Yun ............................... 343/703 |
| 8,019,380 | B2 * | 9/2011 | Lin ............................. 455/552.1 |
| 8,103,470 | B2 * | 1/2012 | Teshirogi et al. ................ 702/76 |
| 2005/0280591 | A1 * | 12/2005 | Kadambi et al. .............. 343/703 |
| 2009/0143091 | A1 * | 6/2009 | Kim et al. ..................... 455/522 |
| 2010/0153045 | A1 * | 6/2010 | Teshirogi et al. ............. 343/703 |
| 2010/0238077 | A1 * | 9/2010 | Cho et al. ...................... 343/703 |

FOREIGN PATENT DOCUMENTS

| KR | 10-1997-0064396 | | 12/1997 |
| KR | 2004-0068898 | A | 8/2004 |
| KR | 10-0693642 | A | 3/2007 |
| KR | 10-2009-0058265 | A | 6/2009 |

* cited by examiner

*Primary Examiner* — Trinh Dinh
(74) *Attorney, Agent, or Firm* — Rabin & Berdo, P.C.

(57) ABSTRACT

An apparatus for measuring radiated power of a terminal includes: an enclosure including a pair of couplers configured to couple an electromagnetic field radiated from the terminal or a substitution antenna and a measurement jig configured to rotate the terminal or the substitution antenna, the terminal or the substitution antenna being supposed to be arranged between the pair of couplers, with reference to at least one of X, Y, and Z axes; a driver installed outside the enclosure to drive the measurement jig; a signal generator configured to generate a feed signal transferred to the substitution antenna when the substitution antenna is arranged on the measurement jig; a feed signal transmitter configured to transfer the feed signal generated by the signal generator to the substitution antenna; and a spectrum analyzer configured to measure power of a radiated signal radiated from the terminal or the substitution antenna.

13 Claims, 5 Drawing Sheets

APPARATUS AND METHOD FOR MEASURING RADIATED POWER OF TERMINAL

CROSS-REFERENCE(S) TO RELATED APPLICATIONS

The present application claims priority of Korean Patent Application No. 10-2009-0120113, filed on Dec. 4, 2009, which is incorporated herein by reference in its entirety.

BACKGROUND OF THE INVENTION

1. Field of the Invention

Exemplary embodiments of the present invention relate to an apparatus and a method for measuring radiated power; and, more particularly, to an apparatus and method for measuring the Effective Radiated Power and Effective Isotropically Radiated Power (ERP/EIRP) of terminals such as cellular phones, PCS phones, IMT-2000 phones, etc.

2. Description of Related Art

Various wireless devices, specifically terminals (mobile phones), operate very close to users. Therefore, correct control of radiated power of terminals is crucial in terms of stability and radio environment. In this regard, a number of nations have enacted laws for measuring and regulating the radiated power of mobile devices, including terminals, to deal with the safety or interference issue.

Measurement of power radiated from a terminal can be regarded as a kind of follow-up management. This means that, once a customer has purchased a terminal, it is important to accurately confirm in what situation the terminal outputs the maximum radiated power.

In this connection, parameters for measuring power radiated from terminals include Effective Radiated Power (ERP) and Effective Isotropically Radiated Power (EIRP).

Methods for measuring the radiated power of terminals include a test mode-based method, which entirely relies on a terminal test mode provided by the terminal manufacturer, and a method employing a base station simulator.

The test mode-based method has the following problems: The test mode program is not embedded in terminals used by customers, but is separately developed/managed by the manufacturer. This makes it difficult for any user, government, or verification institute to objectively measure the radiated power of terminals. There is even a possibility that the manufacturer will neglect to provide the test mode program or manipulate the test. Furthermore, this method is not suited to randomly sampling and testing terminals frequently. The second method requires a base station simulator, which is very expensive. Even if such a base station simulator is employed, a test mode must also be supplied from the manufacturer. It is even more difficult to fabricate a universal simulator, making this method unsuited to random sampling and frequently testing. Measurement by this method also requires an electromagnetic anechoic chamber, outdoor test field, or semi-anechoic chamber, which is both expensive and occupies large installation space.

SUMMARY OF THE INVENTION

An embodiment of the present invention is directed to an apparatus and a method for measuring radiated power, which can measure the ERP/EIRP of a terminal without using a test mode program provided by the terminal manufacturer.

Another embodiment of the present invention is directed to an apparatus and a method for measuring radiated power, which can measure the ERP/EIRP of a terminal without using an expensive base station simulator.

Another embodiment of the present invention is directed to an apparatus and a method for measuring radiated power, which can measure the ERP/EIRP of a terminal in a very small space without using an electromagnetic anechoic chamber, outdoor test field, or semi-anechoic chamber.

Another embodiment of the present invention is directed to an apparatus and a method for measuring radiated power, which can measure the ERP/EIRP of a terminal accurately based on a substitution measurement method.

Another embodiment of the present invention is directed to an apparatus and a method for measuring radiated power, which can remove wave disturbance caused by movement of an antenna cable during normal antenna measurement, and which can freely measure the ERP/EIRP of a terminal in a very small space.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, an apparatus for measuring radiated power of a terminal includes: an enclosure including a pair of couplers configured to couple an electromagnetic field radiated from the terminal or a substitution antenna and a measurement jig configured to rotate the terminal or the substitution antenna, the terminal or the substitution antenna being supposed to be arranged between the pair of couplers, with reference to at least one of X, Y, and Z axes; a driver installed outside the enclosure to drive the measurement jig; a signal generator configured to generate a feed signal transferred to the substitution antenna when the substitution antenna is arranged on the measurement jig; a feed signal transmitter configured to transfer the feed signal generated by the signal generator to the substitution antenna; and a spectrum analyzer configured to measure power of a radiated signal radiated from the terminal or the substitution antenna.

In accordance with another embodiment of the present invention, a method for measuring radiated power of a terminal by the radiated power measurement apparatus includes: arranging the terminal on the measurement jig and applying a control signal to the driver to rotate the measurement jig continuously and determine, by the spectrum analyzer, in what orientation of the terminal maximum radiated power occurs; arranging the substitution antenna in a position, the terminal having been arranged in the position, and transmitting a feed signal generated by the signal generator to the substitution antenna through the feed signal transmitter; applying a control signal to the driver to rotate the measurement jig continuously and determine, by the spectrum analyzer, in what orientation of the substitution antenna maximum radiated power occurs; measuring, by the spectrum analyzer, power intensity of a feed signal generated by the signal generator when radiated power radiated from the substitution antenna in a position, the substitution antenna exhibiting maximum radiated power in the position, is equal to the maximum radiated power of the terminal measured in said arranging the substitution antenna in a position, the terminal having been arranged in the position, and transmitting a feed signal generated by the signal generator to the substitution antenna through the feed signal transmitter; and compensating loss of the feed signal transmitter from the power intensity of the feed signal measured in said measuring, by the spectrum analyzer, power intensity of a feed signal generated by the signal generator when radiated power radiated from the substitution antenna in a position, the substitution antenna exhibiting maximum radiated power in the position, is equal to the maximum radiated power of the terminal.

DESCRIPTION OF SPECIFIC EMBODIMENTS

Figure 1:
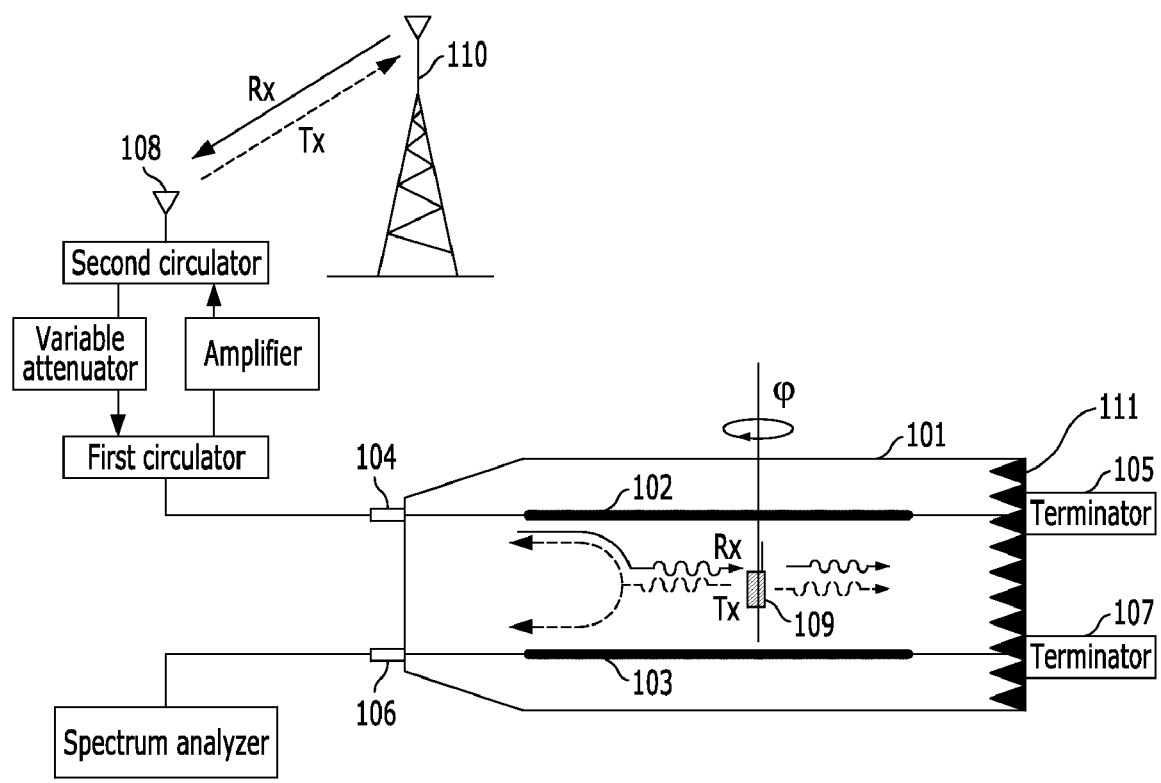
FIG. 1 illustrates the construction of an apparatus for measuring maximum radiated power of a terminal.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 illustrates an apparatus for measuring maximum radiated power of a terminal.

The apparatus shown in FIG. 1 includes an enclosure (CTL-cell) 101 shielded from external radio environment, devices (first and second circulators, a variable attenuator, and an amplifier) for communication between a base station 110 and a terminal 109 arranged inside the enclosure 101, and a spectrum analyzer configured to measure the power of a radiated signal radiated from the terminal 109.

A pair of couplers (conductor plates) 102 and 103 are arranged parallel with each other inside the enclosure 101 to couple an electromagnetic field radiated from the terminal 109, which is arranged between the couplers 102 and 103.

The input port 104 of the upper coupler 102 is connected to the first circulator, which is connected to the variable attenuator and the amplifier. The second circulator is connected to the variable attenuator and the amplifier, and is configured to wirelessly communicate with the base station 110 via a link antenna 108. Specifically, a signal received from the base station 110 via the link antenna 108 is transferred to the input port 104 through the second circulator, the variable attenuator, and the first circulator, and a transmitted signal outputted from the input port 104 is transmitted to the base station 110 through the first circulator, the amplifier, the second circulator, and the link antenna 108.

The output port of the upper coupler 102 is connected to a first terminator 105, and the isolated port of the coupler 103 is connected to a second terminator 107. The coupled port 106 of the coupler 103 is connected to the spectrum analyzer or power measurement equipment (not shown).

A method for measuring the maximum radiated power of the terminal 109 using the apparatus shown in FIG. 1 will now be described.

The variable attenuator is set to 0 dB, and a call is made to the terminal 109 inside the enclosure 101 using another terminal outside the enclosure 101 so that both terminals communicate with each other.

The terminal 109 is rotated to adjust the orientation so that the power of a radiated signal Tx radiated from the terminal 109 maintains the maximum value at the coupler 103.

A received signal Rx received from the base station 110 is inputted to the terminal 109 through the link antenna 108, the second circulator, the variable attenuator, the first circulator, and the input port 104.

The terminal 109 then emits a RF radiated signal Tx, which is transferred to the base station 110 through the input port 104, the first circulator, the amplifier, the second circulator, and the link antenna 108, and is also transferred to the spectrum analyzer through the coupled port 106 of the coupler 103. When the RF radiated signal Tx reaches the base station 110, the terminal 109 and the base station 110 are linked to each other.

The base station 110, which is linked to the terminal 109, then performs operation for controlling radiated power of the terminal 109. The RF radiated signal Tx transferred to the spectrum analyzer connected to the coupled port 106 has very large power compared with the received signal Rx received from the base station 110, and therefore can be regarded as pure radiated power of the terminal 109.

The amount of attenuation of the variable attenuator installed between the link antenna 108 and the input port 104 is adjusted to vary the power intensity of the radiated signal Tx transferred to the base station 110. Then, the base station 110 again requests the terminal 109 to output the radiated signal. If the value of the variable attenuator is increased continuously (i.e. if the amount of attenuation increases), the base station 110 accordingly requests the terminal 109 to output a higher power value until the maximum radiated power is reached. The spectrum analyzer then can measure the maximum radiated power of the terminal 109 using the channel power and max hold function.

In FIG. 1, reference numeral 111 refers to a frequency absorber, which is configured to absorb signals radiated from the terminal 109.

Figure 2:
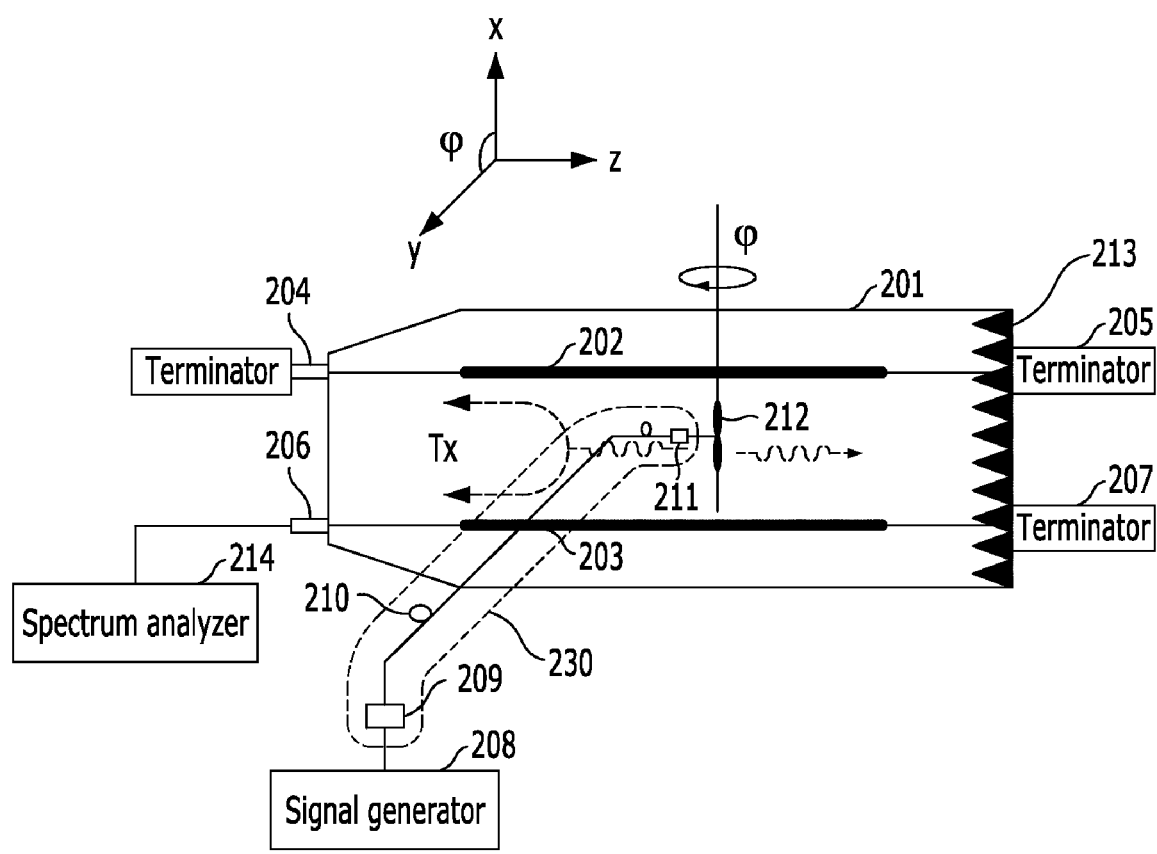
FIG. 2 illustrates the construction of a radiated power measurement apparatus in accordance with an embodiment of the present invention.

After measuring the maximum radiated power of the terminal 109 by the apparatus shown in FIG. 1 in this manner, the ERP/EIRP of the terminal 109 can be easily measured using a radiated power measurement apparatus in accordance with an embodiment of the present invention shown in FIG. 2. It is also possible to measure the maximum radiated power of the terminal using the radiated power measurement apparatus in accordance with an embodiment of the present invention shown in FIG. 2 and measure the ERP/EIRP of the terminal using a so-called substitution measurement method. The radiated power measurement apparatus in accordance with an embodiment of the present invention shown in FIG. 2 will now be described.

FIG. 2 illustrates the construction of a radiated power measurement apparatus in accordance with an embodiment of the present invention.

Referring to FIG. 2, a radiated power measurement apparatus in accordance with an embodiment of the present invention includes a pair of couplers 202 and 203 configured to couple an electromagnetic field radiated from a terminal or substitution antenna 212, which is to be tested, an enclosure 201 having a measurement jig (not shown) configured to rotate the terminal or substitution antenna 212 by a predetermined angle cp with reference to at least one of X, Y, and Z axes in a uniform field region having uniform field distribution characteristics, a driver (not shown) configured to drive the measurement jig (not shown), a signal generator 208 configured to generate a feed signal transferred to the substitution antenna 212, a feed signal transmitter 230 configured to transfer the feed signal from the signal generator 208 to the substitution antenna 212, and a spectrum analyzer 214 configured to measure the power of a signal radiated from the substitution antenna 212.

The enclosure 201 includes a pair of couplers 202 and 203 and a measurement jig (not shown) configured to rotate or retain a terminal or a substitute antenna 212. The pair of couplers 202 and 203 are arranged parallel with each other. It is to be noted that the terminal and the substitution antenna 212 cannot be arranged on the measurement jig (not shown) simultaneously, but only one of them can be arranged thereon.

The measurement jig (not shown) is rotated or retained by a driver (not shown) installed on the outer wall of the enclosure 201. It will be described in detail with reference to FIG. 3.

Figure 3:
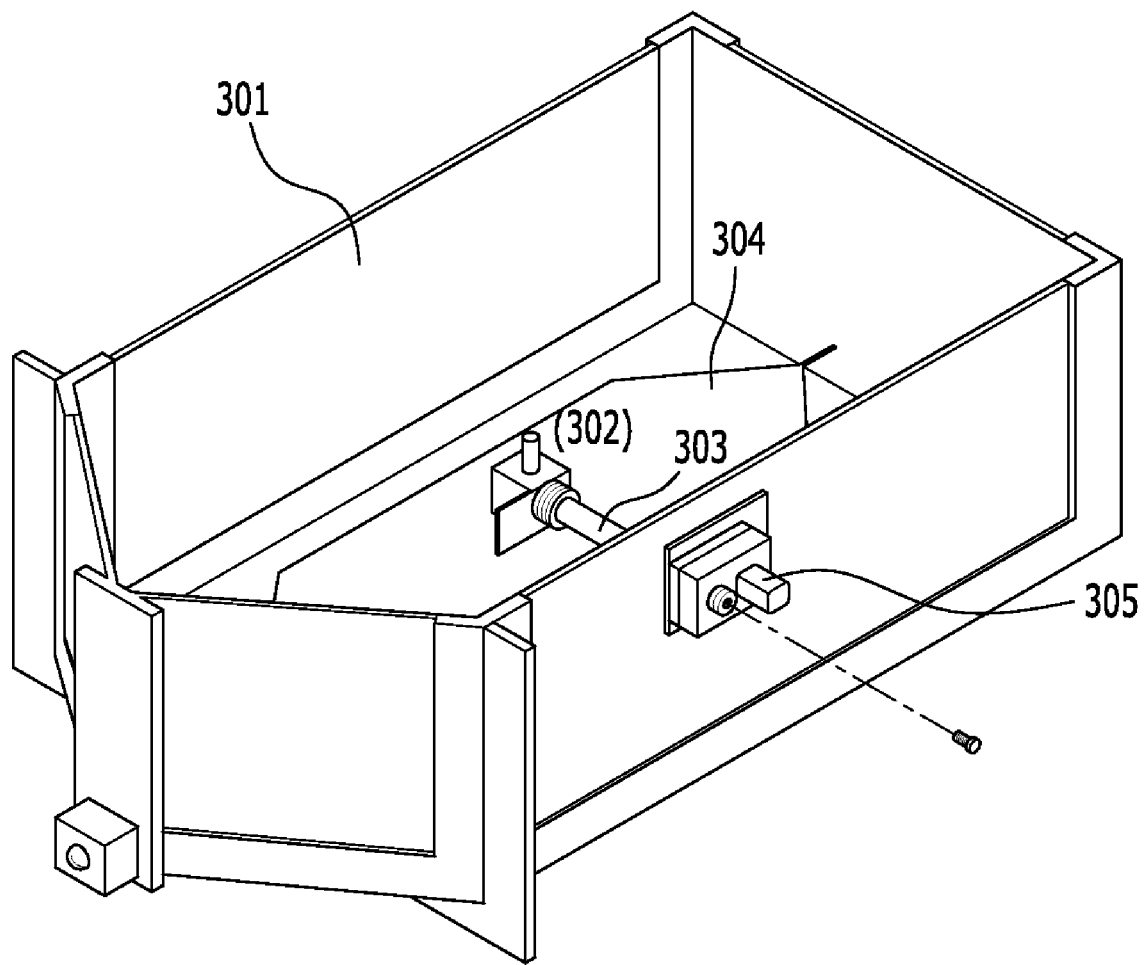
FIG. 3 illustrates the actual construction of the radiated power measurement apparatus in accordance with an embodiment of the present invention shown in FIG. 2.

FIG. 3 illustrates the actual construction of the radiated power measurement apparatus in accordance with an embodiment of the present invention shown in FIG. 2. Reference numeral 301 refers to the enclosure 201 shown in FIG. 2, reference numerals 302 and 303 refer to the measurement jig, reference numeral 305 refers to the driver, and reference numeral 304 refers to the coupler 203 shown in FIG. 2. The measurement jig 302 and 303 is configured to rotate with reference to three axes X, Y, and Z to adjust the orientation in which the terminal or substitution antennas has the maximum radiated power. The measurement jig 302 and 303 may be made of non-metallic material so that it does not influence the radiated pattern radiated from the terminal or substitution antenna.

Referring to FIG. 2 again, the first and second terminators 205 and 207 have the same functions as the first and second terminators 105 and 107 shown in FIG. 1, respectively, and repeated description thereof will be omitted herein.

The input port 204 of the coupler 202 is connected to the same devices (first and second circulators, variable attenuator, and amplifier) to which the input port 104 shown in FIG. 1 is connected, when the maximum radiated power of the terminal is measured, but is terminated as shown in FIG. 2 when measuring the radiated power of the substitution antenna 212.

Figure 4:
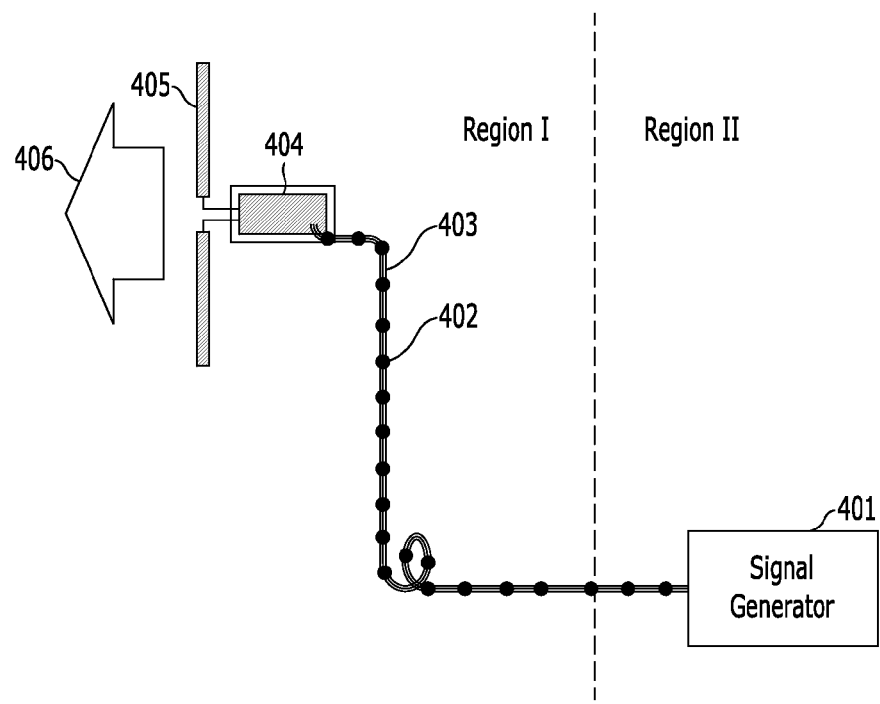
FIG. 4 illustrates a feed signal transmitter in a radiated power measurement apparatus in accordance with an embodiment of the present invention.

The feed signal transmitter 230 is configured to transfer a feed signal, which is generated by the signal generator 208, to the substitution antenna 212 positioned on the measurement jig (not shown). The feed signal transmitter 230, as shown in FIG. 4, may be implemented with a coaxial cable 403 coupled with ferrite 402. In the drawing, Region I refers to the inside of the enclosure, and Region II refers to the outside of the enclosure.

However, if the feed signal transmitter 230 is implemented with a coaxial cable 403 including metallic substance (e.g. copper), the radiated pattern emitted to the back of the substitution antenna 405 may be disturbed by the coaxial cable 403.

This problem can be avoided by implementing the feed signal transmitter 230 with non-metallic material. Specifically, the feed signal transmitter 230 may include, as shown in FIG. 2, an Electric-to-Optical (E/O) converter 209, an optical fiber 210, and an Optical-to-Electrical (O/E) converter 211. In this case, a RF feed signal generated by the signal generator 208 is converted into an optical signal by the E/O converter 209, and the optical signal is transferred to the O/E converter 211 through the optical fiber 211. The O/E converter 211 converts the optical signal into an electric signal, i.e. RF feed signal, which is transferred to the substitution antenna 212.

As such, implementation of the feed signal transmitter 230 with an E/O converter 209, an optical fiber 210, and an O/E converter 211 prevents radio disturbance which could occur if a coaxial cable is used.

Figure 5:
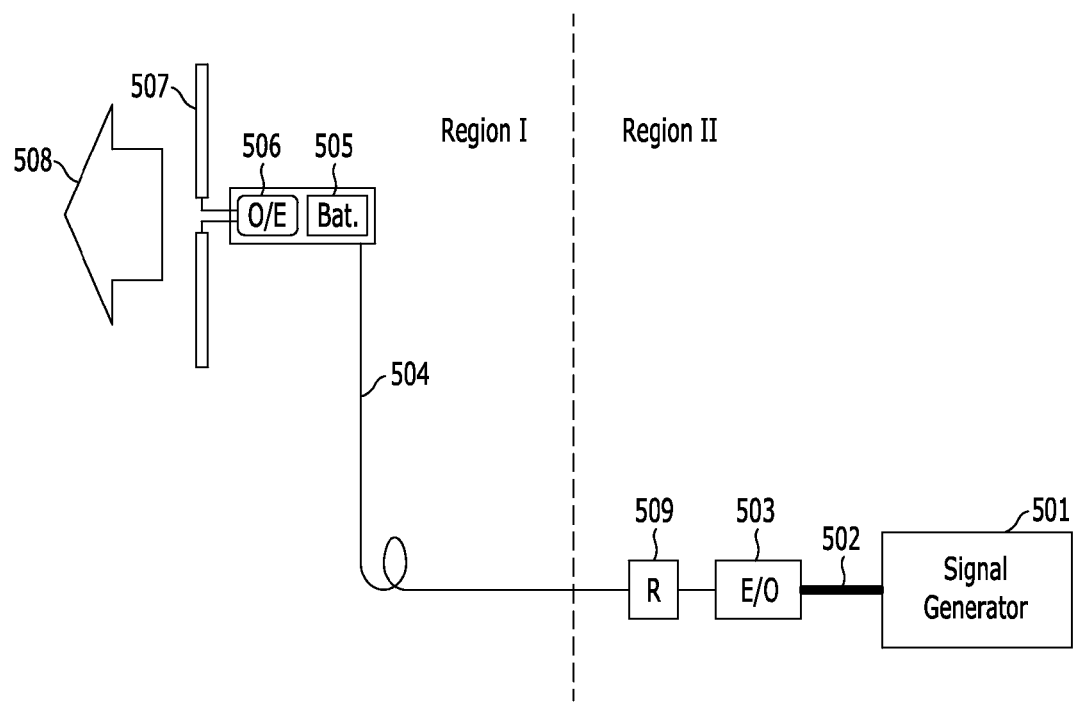
FIG. 5 illustrates a feed signal transmitter in a radiated power measurement apparatus in accordance with another embodiment of the present invention.

Alternatively, the feed signal transmitter 230 may include, as shown in FIG. 5, an E/O converter 503, an optical fiber 504, a battery 505, and an O/E converter 506. The battery 505 servers as a power supply for driving the O/E converter 506. The feed signal transmitter 230 may further include an optical rotary joint (R) 509 between the optical fiber 504 and the E/O converter 503. The optical rotary joint 509 is configured to rotate the optical fiber 504 together with the measurement jig to prevent the optical fiber 504 from being twisted by rotation of the measurement jig. Reference numeral 502 refers to a transmission line configured to transmit a feed signal from the signal generator 501 to the E/O converter. The transmission line 502 may be implemented with one of a coaxial cable and an optical fiber.

Figure 6:
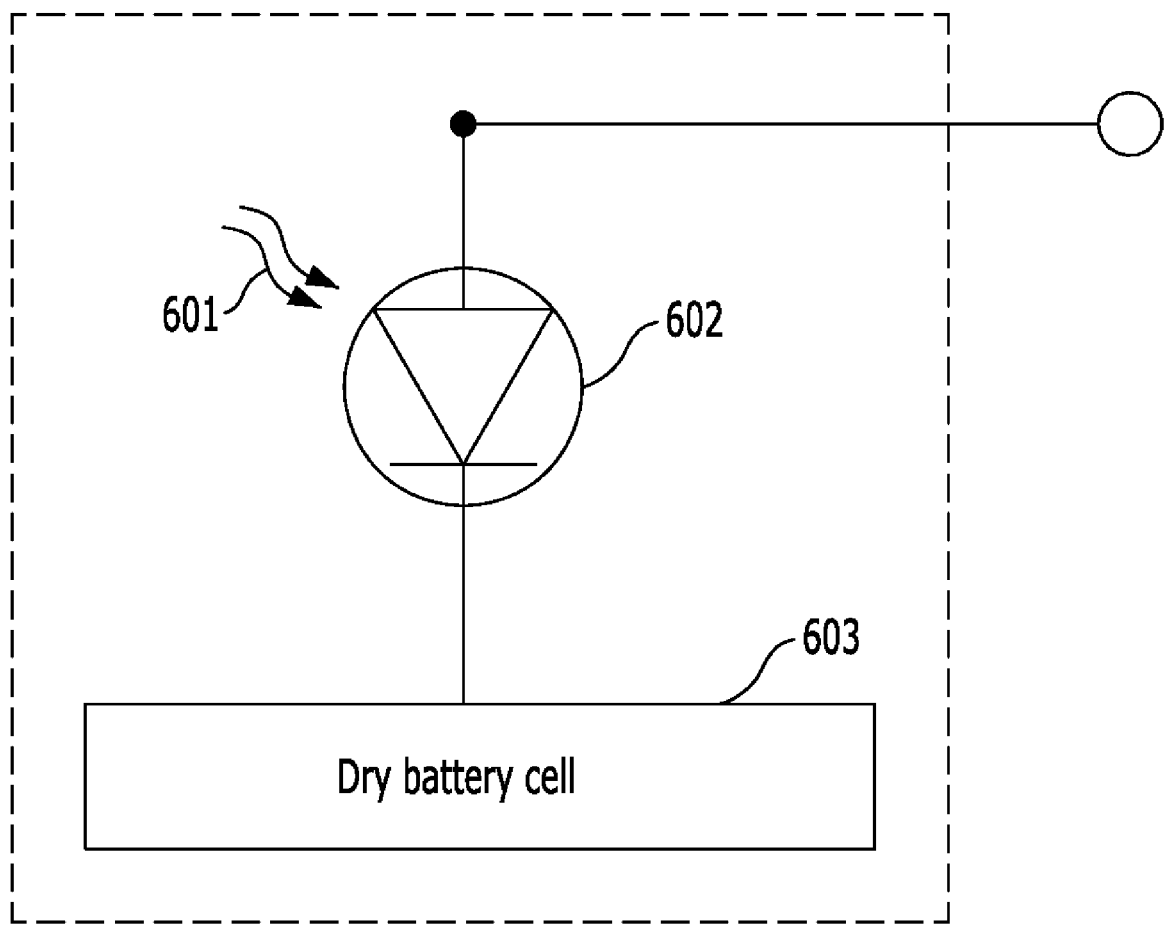
FIG. 6 is a circuit diagram of the O/E converter shown in FIGS. 2 and 5.

The O/E converter 211 may be implemented as shown in FIG. 6. Specifically, the O/E converter 211 shown in FIG. 6 includes a PIN diode 602 and a dry battery cell 603 configured to drive the PIN diode 602. This configuration prevents disturbance to the radiated pattern of the substitution antenna 212 and reduces the size of the O/E converter 211.

In FIG. 2, reference numeral 213 refers to a frequency absorber, which is configured to absorb signals radiated from the terminal or the substitution antenna 212.

A method for measuring the ERP/EIRP of a terminal using a radiated power measurement apparatus in accordance with an embodiment of the present invention will now be described.

Firstly, the maximum radiated power of a terminal is measured using the radiated power measurement apparatus in accordance with an embodiment of the present invention shown in FIG. 2. Specifically, a terminal is arranged on the measurement jig (not shown), and the input port 204 is connected to the first and second circulators, the variable attenuator, the amplifier, and the link antenna shown in FIG. 1 to be linked with the base station 110. The signal generator 208 is controlled not to function. A predetermined control signal is applied to the driver (not shown) to rotate the measurement jig (not shown) with reference to at least one of X, Y, and Z axes to determine the orientation of the terminal, in which the maximum radiated power occurs, by the spectrum analyzer so that the position of the terminal, in which the maximum radiated power occurs, is identified.

The maximum radiated power of the terminal can be measured using the radiated power measurement apparatus shown in FIG. 1. This means that the maximum radiated power of the terminal can be measured by one of the radiated power measurement apparatuses shown in FIGS. 1 and 2.

After measuring the maximum radiated power of the terminal, a substitution antenna 212, the antenna gain of which is known, is arranged in the position of the terminal as shown in FIG. 2. The input port 204 is terminated, and a feed signal generated by the signal generator 208 is transmitted to the substitution antenna 212 through the feed signal transmitter 230, which includes the E/O converter 209, the optical fiber 210, and the O/E converter 211 as shown in FIG. 2. The measurement jig (not shown) is driven to adjust the orientation of the substitution antenna 212 so that the spectrum analyzer 214 can read the maximum radiated power of the substitution antenna 212 in response to the applied feed signal.

After determining the orientation in which the substitution antenna 212 exhibits the maximum radiated power, the power intensity of the feed signal generated by the signal generator 208 is adjusted until the spectrum analyzer 214 can read the maximum radiated power value of the terminal measured previously.

When it is confirmed as a result of the adjustment that the spectrum analyzer 214 can read the maximum radiated output value of the terminal measured previously, the optical link loss of the feed signal transmitter 230, which is known, is compensated (subtracted) from the power intensity of a feed signal outputted from the signal generator 208 at this time. Thus, the ERP of the terminal is obtained in a very simple manner.

Such implementation of the feed signal transmitter 230 in an optical link structure guarantees a substantially reduced weight and has no influence on the electromagnetic field inside the enclosure, which is substantially smaller than an electromagnetic anechoic chamber, outdoor test field, or semi-anechoic chamber. If the feed signal transmitter 230 is implemented with a coaxial cable made of copper instead of the optical link structure, the coaxial cable may disturb the electromagnetic field inside the enclosure, and any change in position can also disturb the electromagnetic field. However, the optical link structure is entirely based on non-metallic material, i.e. fiberglass, and does not disturb the electromagnetic field at all. Furthermore, the high degree of flexibility and lightness make application to a very small space, i.e. enclosure, very plausible.

In accordance with the exemplary embodiments of the present invention, the apparatus and method for measuring radiated power can measure the ERP/EIRP of a terminal without using a test mode program provided by the terminal manufacturer. The apparatus and method can measure the ERP/EIRP of a terminal without using an expensive base station simulator. The apparatus and method can measure the ERP/EIRP of a terminal in a very small space without using an electromagnetic anechoic chamber, outdoor test field, or semi-anechoic chamber. The apparatus and method can measure the ERP/EIRP of a terminal accurately based on a substitution measurement method. The apparatus and method can remove wave disturbance caused by movement of an antenna cable during normal antenna measurement, and can freely measure the ERP/EIRP of a terminal in a very small space.

While the present invention has been described with respect to the specific embodiments, it will be apparent to those skilled in the art that various changes and modifications may be made without departing from the spirit and scope of the invention as defined in the following claims.

What is claimed is:

1. An apparatus for measuring radiated power of a terminal, comprising:
    an enclosure comprising a pair of couplers configured to couple an electromagnetic field radiated from the terminal or a substitution antenna and a measurement jig configured to rotate the terminal or the substitution antenna, the terminal or the substitution antenna being supposed to be arranged between the pair of couplers, with reference to at least one of X, Y, and Z axes;
    a driver installed outside the enclosure to drive the measurement jig;
    a signal generator configured to generate a feed signal transferred to the substitution antenna when the substitution antenna is arranged on the measurement jig;
    a feed signal transmitter configured to transfer the feed signal generated by the signal generator to the substitution antenna; and
    a spectrum analyzer configured to measure power of a radiated signal radiated from the terminal or the substitution antenna.

2. The apparatus of claim 1, wherein the feed signal transmitter is made of non-metallic material.

3. The apparatus of claim 2, wherein the feed signal transmitter comprises:
    an E/O converter configured to convert the feed signal generated by the signal generator into an optical signal;
    an optical fiber configured to transmit the feed signal converted into the optical signal; and
    an O/E converter configured to convert the optical signal transmitted through the optical fiber back into the feed signal generated by the signal generator and provide the substitution antenna with the feed signal.

4. The apparatus of claim 3, wherein the feed signal transmitter further comprises a battery configured to provide the O/E converter with a power supply.

5. The apparatus of claim 3, wherein the O/E converter comprises:
    a PIN diode configured to convert the optical signal back into the feed signal generated by the signal generator; and
    a dry battery cell configured to provide the PIN diode with a power supply.

6. The apparatus of claim 3, wherein the feed signal transmitter further comprises an optical rotary joint configured to rotate the optical fiber in the same manner as the measurement jig is rotated to adjust orientation of the substitution antenna.

7. A method for measuring radiated power of a terminal by a radiated power measurement apparatus including: an enclosure including a pair of couplers configured to couple an electromagnetic field radiated from the terminal or a substitution antenna and a measurement jig configured to rotate the terminal or the substitution antenna, the terminal or the substitution antenna being supposed to be arranged between the pair of couplers, with reference to at least one of X, Y, and Z axes; a driver installed outside the enclosure to drive the measurement jig; a signal generator configured to generate a feed signal transferred to the substitution antenna when the substitution antenna is arranged on the measurement jig; a feed signal transmitter configured to transfer the feed signal generated by the signal generator to the substitution antenna; and a spectrum analyzer configured to measure power of a radiated signal radiated from the terminal or the substitution antenna, the method comprising:
    arranging the terminal on the measurement jig and applying a control signal to the driver to rotate the measurement jig continuously and determine, by the spectrum analyzer, in what orientation of the terminal maximum radiated power occurs;
    arranging the substitution antenna in a position, the terminal having been arranged in the position, and transmitting a feed signal generated by the signal generator to the substitution antenna through the feed signal transmitter;
    applying a control signal to the driver to rotate the measurement jig continuously and determine, by the spectrum analyzer, in what orientation of the substitution antenna maximum radiated power occurs;
    measuring, by the spectrum analyzer, power intensity of a feed signal generated by the signal generator when radiated power radiated from the substitution antenna in a position, the substitution antenna exhibiting maximum radiated power in the position, is equal to the maximum radiated power of the terminal measured in said arranging the substitution antenna in a position, the terminal having been arranged in the position, and transmitting a feed signal generated by the signal generator to the substitution antenna through the feed signal transmitter; and compensating loss of the feed signal transmitter from the power intensity of the feed signal measured in said measuring, by the spectrum analyzer, power intensity of a feed signal generated by the signal generator when radiated power radiated from the substitution antenna in a position, the substitution antenna exhibiting maximum radiated power in the position, is equal to the maximum radiated power of the terminal.

8. The method of claim 7, wherein the feed signal transmitter is made of non-metallic material.

9. The method of claim 8, wherein the feed signal transmitter comprises:

an E/O converter configured to convert the feed signal generated by the signal generator into an optical signal;

an optical fiber configured to transmit the feed signal converted into the optical signal; and an O/E converter configured to convert the optical signal transmitted through the optical fiber back into the feed signal generated by the signal generator and provide the substitution antenna with the feed signal.

10. The method of claim 9, wherein the feed signal transmitter further comprises a battery configured to provide the O/E converter with a power supply.

11. The method of claim 9, wherein the O/E converter comprises:

a PIN diode configured to convert the optical signal back into the feed signal generated by the signal generator; and a dry battery cell configured to provide the PIN diode with a power supply.

12. The method of claim 9, wherein the feed signal transmitter further comprises an optical rotary joint configured to rotate the optical fiber in the same manner as the measurement jig is rotated to adjust orientation of the substitution antenna.

13. The method of claim 9, wherein the loss of the feed signal transmitter is optical link loss of the optical fiber.

* * * * *